United States Patent
Takeda

(10) Patent No.: US 11,630,254 B2
(45) Date of Patent: Apr. 18, 2023

(54) WIRE GRID POLARIZING PLATE HAVING TRAPEZOIDAL ABSORPTION LAYER

(71) Applicant: Dexerials Corporation, Tokyo (JP)

(72) Inventor: Tomu Takeda, Tokyo (JP)

(73) Assignee: Dexerials Corporation, Tokyo (JP)

( * ) Notice: Subject to any disclaimer, the term of this patent is extended or adjusted under 35 U.S.C. 154(b) by 233 days.

(21) Appl. No.: 17/095,215

(22) Filed: Nov. 11, 2020

(65) Prior Publication Data

US 2021/0080634 A1 Mar. 18, 2021

Related U.S. Application Data

(63) Continuation of application No. 16/230,619, filed on Dec. 21, 2018, now Pat. No. 10,890,703.

(30) Foreign Application Priority Data

Dec. 28, 2017 (JP) .............................. JP2017-253277

(51) Int. Cl.
*G02B 5/30* (2006.01)
*B82Y 40/00* (2011.01)
(Continued)

(52) U.S. Cl.
CPC ............ *G02B 5/3058* (2013.01); *B82Y 40/00* (2013.01); *G02B 7/008* (2013.01); *G03F 7/0002* (2013.01); *G02F 1/133548* (2021.01)

(58) Field of Classification Search
CPC .................. G02B 5/3058; G02F 1/133548
See application file for complete search history.

(56) References Cited

U.S. PATENT DOCUMENTS

2008/0278811 A1 11/2008 Perkins et al.
2009/0066885 A1 3/2009 Kumai
(Continued)

FOREIGN PATENT DOCUMENTS

CN 102455456 A 5/2012
CN 107407770 A 11/2017
(Continued)

OTHER PUBLICATIONS

Office Action issued in the counterpart Japanese Patent Application No. 2019-086625, dated Aug. 31, 2021 (8 pages).
(Continued)

*Primary Examiner* — Ryan S Dunning
(74) *Attorney, Agent, or Firm* — Osha Bergman Watanabe & Burton LLP

(57) ABSTRACT

To provide a polarizing plate capable of excellently controlling reflectance characteristics, a polarizing plate manufacturing method, and an optical apparatus including the polarizing plate. Provided is a polarizing plate 10 with a wire grid structure, including: a transparent substrate 1 and a grid-shaped convex portion 6 arranged on the transparent substrate at a pitch shorter than a wavelength of light of a use band and extending in a predetermined direction, wherein the grid-shaped convex portion 6 includes a reflection layer 2, a first dielectric layer 3, and an absorption layer 4 in order from the transparent substrate 1, and wherein the reflection layer and the first dielectric layer have substantially the same width and a minimum width of the absorption layer is smaller than a minimum width of the reflection layer and the first dielectric layer as viewed from a predetermined direction.

10 Claims, 18 Drawing Sheets

(51) Int. Cl.
*G02B 7/00* (2021.01)
*G03F 7/00* (2006.01)
*G02F 1/1335* (2006.01)

(56) References Cited

U.S. PATENT DOCUMENTS

| | | |
|---|---|---|
| 2011/0170186 A1 | 7/2011 | Sawaki |
| 2012/0105745 A1 | 5/2012 | Kumai |
| 2012/0250154 A1 | 10/2012 | Davis |
| 2013/0215507 A1 | 8/2013 | Sasaki et al. |
| 2013/0215508 A1 | 8/2013 | Sasaki |
| 2014/0063467 A1 | 3/2014 | Takahashi et al. |
| 2018/0081103 A1 | 3/2018 | Takeda |
| 2019/0041564 A1 | 2/2019 | Nielson et al. |

FOREIGN PATENT DOCUMENTS

| | | |
|---|---|---|
| JP | 2008-216956 A | 9/2008 |
| JP | 201044416 A | 2/2010 |
| JP | 2010210829 A | 9/2010 |
| JP | 2010530994 A | 9/2010 |
| JP | 2011141468 A | 7/2011 |
| JP | 2013167824 A | 8/2013 |
| JP | 2014052439 A | 3/2014 |
| JP | 2014527203 A | 10/2014 |
| JP | 2015212741 A | 11/2015 |
| JP | 2016212156 A | 12/2016 |
| JP | 6577641 B2 | 9/2019 |

OTHER PUBLICATIONS

Notice of Reasons for Rejection issued in the counterpart Japanese Patent Application No. 2017-253277, dated Apr. 3, 2018 (2 pages).
Notice of Reasons for Rejection issued in the counterpart Japanese Patent Application No. 2017-253277, dated Jul. 3, 2018 (4 pages).
Notice of Reasons for Rejection issued in the counterpart Japanese Patent Application No. 2018-153971, dated Oct. 23, 2018 (3 pages).
Office Action issued in Chinese Application No. 201811531052.6; dated Jun. 11, 2021 (22 pages).
Second Notice of Review Opinion issued in Chinese Application No. 201811531052.6 dated Nov. 1, 2021 (17 pages).
Notice of Reasons for Refusal issued in Japanese Application No. 2019-086625 dated Dec. 7, 2021 (8 pages).

WIRE GRID POLARIZING PLATE HAVING TRAPEZOIDAL ABSORPTION LAYER

CROSS-REFERENCE TO RELATED APPLICATIONS

This application is based on and claims the benefit of priority from Japanese Patent Application No. 2017-253277, filed on 28 Dec. 2017, and U.S. patent application Ser. No. 16/230,619, filed on Dec. 21, 2018, titled "POLARIZING PLATE, POLARIZING PLATE MANUFACTURING METHOD, AND OPTICAL APPARATUS HAVING SPECIFIED MINIMUM WIDTH OF ABSORPTION LAYER". The content of both of these applications is incorporated herein by reference.

BACKGROUND OF THE INVENTION

Field of the Invention

The present invention relates to a polarizing plate, a polarizing plate manufacturing method, and an optical apparatus.

Related Art

Conventionally, as a polarizing element, there has been proposed an absorption wire grid type polarizing element which cancels light reflected from a metal grating by an interference effect and transmits the other polarized light component by forming a metal grating on a substrate at a pitch shorter than a wavelength of light of a use band and forming a dielectric layer and an inorganic particle layer on the metal grating. In such a polarizing element, in recent years, there has been a request for controlling reflectance characteristics under the environment of strong light together with high transmittance characteristics as the brightness of a liquid crystal projector increases.

Here, the reflectance characteristics are determined by the interference between layers constituting a lattice structure or the absorption into the layer. Then, a method of controlling the reflectance by using a material satisfying a request for a dielectric layer or the like is proposed (see Patent Document 1). However, in Patent Document 1, since the layers are designed in a rectangular shape, it is difficult to form a perfect rectangular shape in a nano level and thus it is very difficult to design a material with a shape.

Further, there is proposed a method of controlling reflectance characteristics of a polarizing element obtained by forming a fine pattern on a resinous base material before forming a metal layer and controlling a reflectance and a wavelength of the base material (see Patent Document 2). However, since the base material used in Patent Document 2 is formed of resin, heat resistance or light resistance is poor as compared with a wire grid polarizing element formed of an inorganic material. As a result, there is concern for a long-term use under the environment of strong light.

Patent Document 1: Japanese Unexamined Patent Application (Translation of PCT Application), Publication No. 2010-530994 Patent Document 2: Japanese Unexamined Patent Application, Publication No. 2015-212741

SUMMARY OF THE INVENTION

The invention has been made in view of the above-described circumstances and an object of the invention is to provide a polarizing plate capable of excellently controlling reflectance characteristics, a polarizing plate manufacturing method, and an optical apparatus including the polarizing plate.

The inventor has found a polarizing plate which can excellently control reflectance characteristics by using an effect of shifting a wavelength range of a light absorbing action in a polarizing plate having a wire grid structure including a transparent substrate and a grid-shaped convex portion arranged on the transparent substrate at a pitch shorter than a wavelength of light of a use band and extending in a predetermined direction, in which the grid-shaped convex portion includes a reflection layer, a first dielectric layer, and an absorption layer in order from the transparent substrate and a relationship of minimum widths of the reflection layer, the first dielectric layer, and the absorption layer as viewed from the predetermined direction is specified. As a result, the inventor has contrived the invention.

That is, an aspect of the invention is to provide a polarizing plate (for example, a polarizing plate 10 to be described later) with a wire grid structure, including: a transparent substrate (for example, a transparent substrate 1 to be described later) and a grid-shaped convex portion (for example, a grid-shaped convex portion 6 to be described later) arranged on the transparent substrate at a pitch shorter than a wavelength of light of a use band and extending in a predetermined direction, in which the grid-shaped convex portion includes a reflection layer (for example, a reflection layer 2 to be described later), a first dielectric layer (for example, a first dielectric layer 3 to be described later), and an absorption layer (for example, an absorption layer 4 to be described later) in order from the transparent substrate, and in which as viewed from the predetermined direction, the reflection layer and the first dielectric layer are formed to have substantially the same width and the minimum width of the absorption layer is smaller than the minimum width of the reflection layer and the first dielectric layer.

A second dielectric layer may be provided on a surface opposite to the first dielectric layer in the absorption layer and the minimum width of the absorption layer may be smaller than a minimum width of the second dielectric layer as viewed from the predetermined direction.

The reflection layer may be substantially rectangular as viewed from the predetermined direction.

The first dielectric layer may be substantially rectangular as viewed from the predetermined direction.

The transparent substrate may be transparent to a wavelength of light of a use band and may be formed of glass, crystal, or sapphire.

The reflection layer may be formed of aluminum or aluminum alloy.

The first dielectric layer may be formed of Si oxide.

The second dielectric layer may be formed of Si oxide.

The absorption layer may include Fe or Ta and also include Si.

A surface of the polarizing plate to which light is incident may be covered with a protection film formed of a dielectric.

The surface of the polarizing plate to which light is incident may be covered with an organic water-repellent film.

Further, another aspect of the invention is to provide a method of manufacturing a polarizing plate with a wire grid structure, including: a reflection layer forming step of forming a reflection layer on one surface of a transparent substrate; a first dielectric layer forming step of forming a first dielectric layer on a surface opposite to the transparent substrate in the reflection layer; an absorption layer forming step of forming an absorption layer on a surface opposite to the reflection layer in the first dielectric layer; and an etching step of forming a grid-shaped convex portion to be arranged on the transparent substrate at a pitch shorter than a wavelength of light of a use band by selectively etching a formed lamination structure, in which in the etching step, the reflection layer and the first dielectric layer are formed to have substantially the same width and a minimum width of the absorption layer is set to be smaller than a minimum width of reflection layer and the first dielectric layer by combining isotropic etching and anisotropic etching.

Further, another aspect of the invention is to provide an optical apparatus including the polarizing plate.

According to the invention, it is possible to provide the polarizing plate capable of excellently controlling reflectance characteristics, the polarizing plate manufacturing method, and the optical apparatus including the polarizing plate.

DETAILED DESCRIPTION OF THE INVENTION

Hereinafter, an embodiment of the invention will be described in detail with reference to the drawings.

Polarizing Plate

A polarizing plate of the invention is a polarizing plate having a wire grid structure including a transparent substrate and a grid-shaped convex portion arranged on the transparent substrate at a pitch shorter than a wavelength of light of a use band and extending in a predetermined direction. Further, the grid-shaped convex portion includes at least a reflection layer, a first dielectric layer, and an absorption layer in order from the transparent substrate. Additionally, the polarizing plate of the invention may include layers other than the transparent substrate, the reflection layer, the first dielectric layer, and the absorption layer as long as the effect of the invention is exhibited.

Figure 1:
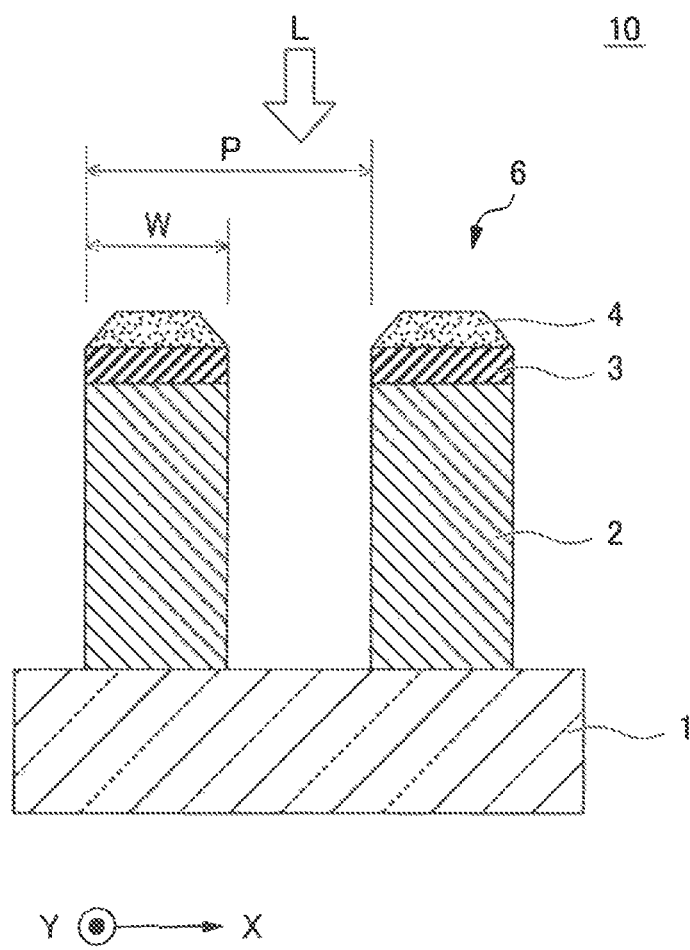
FIG. 1 is a cross-sectional schematic diagram illustrating a polarizing plate according to an embodiment of the invention.

FIG. 1 is a cross-sectional schematic diagram illustrating a polarizing plate 10 according to an embodiment of the invention. As illustrated in FIG. 1, the polarizing plate 10 includes a transparent substrate 1 which is transparent to light of a use band and a grid-shaped convex portion 6 which is arranged on one surface of the transparent substrate 1 at a pitch shorter than a wavelength of light of a use band. The grid-shaped convex portion 6 includes a reflection layer 2, a first dielectric layer 3, and an absorption layer 4 in order from the transparent substrate 1. That is, the polarizing plate 10 has a wire grid structure in which the grid-shaped convex portion 6 formed by laminating the reflection layer 2, the first dielectric layer 3, and the absorption layer 4 in order from the transparent substrate 1 is arranged on the transparent substrate 1 in a one-dimensional lattice shape.

Here, as illustrated in FIG. 1, the extension direction of the grid-shaped convex portion 6 (the predetermined direction) will be referred to as a Y-axis direction. Further, a direction which is orthogonal to the Y-axis direction and in which the grid-shaped convex portion 6 is arranged on the main surface of the transparent substrate 1 will be referred to as an X-axis direction. In this case, the light which is incident to the polarizing plate 10 is incident from a direction orthogonal to the X-axis direction and the Y-axis direction at a position in which the grid-shaped convex portion 6 is formed on the transparent substrate 1.

The polarizing plate with the wire grid structure attenuates the polarized wave (TE wave (S wave)) having an electric field component parallel to the Y-axis direction and transmits the polarized wave (TM wave (P wave)) having an electric field component parallel to the X-axis direction by using four functions of transmission, reflection, interference, and selective light absorption of polarized waves by optical anisotropy. Thus, in FIG. 1, the Y-axis direction indicates the direction of the absorption axis of the polarizing plate and the X-axis direction indicates the direction of the transmission axis of the polarizing plate.

The light which is incident from a position provided with the grid-shaped convex portion 6 in the polarizing plate 10 illustrated in FIG. 1 is attenuated while being partially absorbed when passing through the absorption layer 4 and the first dielectric layer 3. In the light transmitted through the absorption layer 4 and the first dielectric layer 3, the polarized wave (TM wave (P wave)) is transmitted through the reflection layer 2 with high transmittance. Meanwhile, in the light transmitted through the absorption layer 4 and the first dielectric layer 3, the polarized wave (TE wave (S wave)) is reflected by the reflection layer 2. The TE wave which is reflected by the reflection layer 2 is partially absorbed and reflected when passing through the absorption layer 4 and the first dielectric layer 3 and then the light is returned to the reflection layer 2. Further, the TE wave which is reflected by the reflection layer 2 is attenuated by interference when passing through the absorption layer 4 and the first dielectric layer 3. When the TE wave is selectively attenuated as described above, the polarizing plate 10 can obtain desired polarizing characteristics.

As illustrated in FIG. 1, the grid-shaped convex portion of the polarizing plate of the invention includes the reflection layer 2, the first dielectric layer 3, and the absorption layer 4 as viewed from the extension direction of each one-dimensional lattice (a predetermined direction), that is, in a cross-sectional view orthogonal to the predetermined direction.

Here, a dimension of the specification will be described with reference to FIG. 1. The height means a dimension in a direction perpendicular to the main surface of the transparent substrate 1 in FIG. 1. The width W means a dimension in the X-axis direction orthogonal to the height direction as viewed from the Y-axis direction along the extension direction of the grid-shaped convex portion 6. Further, an interval in the X-axis direction of the grid-shaped convex portion 6 when the polarizing plate 10 is viewed from the Y-axis direction along the extension direction of the grid-shaped convex portion 6 will be referred to as a pitch P.

In the polarizing plate of the invention, the pitch P of the grid-shaped convex portion is not particularly limited as long as the pitch is shorter than the wavelength of light of a use band. From the viewpoint of ease of production and stability, the pitch P of the grid-shaped convex portion is preferably, for example, 100 nm to 200 nm. The pitch P of the grid-shaped convex portion can be measured by the observation using a scanning electron microscope or a transmission electron microscope. For example, when the pitch P at four arbitrary positions is measured by using the scanning electron microscope or the transmission electron microscope, the arithmetic mean value thereof can be set to the pitch P of the grid-shaped convex portion. Hereinafter, this measurement method will be referred to as electron microscopy.

In the polarizing plate of the invention, as viewed from the extension direction of the grid-shaped convex portion (a predetermined direction: the Y-axis direction), the reflection layer and the first dielectric layer are formed to have substantially the same width and the minimum width of the absorption layer is smaller than the minimum width of the reflection layer and the first dielectric layer. Accordingly, it is possible to realize the polarizing plate capable of excellently controlling the reflectance characteristics.

(Transparent Substrate)

The transparent substrate (the transparent substrate 1 in FIG. 1) is not particularly limited as long as the substrate has translucency for the light of a use band and can be appropriately selected in accordance with a purpose. The "translucency for the light of a use band" does not mean that the transmittance of the light of a use band is 100% and may be the translucency capable of keeping the function as the polarizing plate. As the light of a use band, for example, visible light having a wavelength of about 380 nm to 810 nm can be exemplified.

The shape of the main surface of the transparent substrate is not particularly limited and a shape (for example, a rectangular shape) is appropriately selected according to a purpose. An average thickness of the transparent substrate is preferably, for example, 0.3 mm to 1 mm.

As a material forming the transparent substrate, a material having a refractive index of 1.1 to 2.2 is preferable and glass, crystal, sapphire, or the like can be exemplified. From the viewpoint of cost and transmittance, glass, particularly, quartz glass (a refractive index of 1.46) or soda lime glass (a refractive index of 1.51) is preferably used. The composition of the components of the glass material is not particularly limited and, for example, an inexpensive glass material such as silicate glass widely distributed as optical glass can be used.

Further, from the viewpoint of thermal conductivity, crystal or sapphire having high thermal conductivity is preferably used. Accordingly, since high light resistance against strong light is obtained, the polarizing plate is preferably used as a polarizing plate for an optical engine of a projector with a large heat generation amount.

Further, when a transparent substrate formed of optically active crystals such as crystal is used, it is preferable to dispose the grid-shaped convex portion 6 in a direction parallel to or perpendicular to the optical axis of the crystal. Accordingly, excellent optical characteristics can be obtained. Here, the optical axis indicates a direction axis in which a difference in refractive index between O (ordinary ray) and E (extraordinary ray) of the light traveling in that direction becomes minimal.

(Reflection Layer)

The reflection layer (the reflection layer 2 in FIG. 1) is formed on one surface of the transparent substrate and a metal film extending in a band shape is arranged in the Y-axis direction which is the absorption axis. Additionally, in the invention, different layers may exist between the transparent substrate and the reflection layer.

The reflection layer 2 of the polarizing plate 10 according to an embodiment of the invention illustrated in FIG. 1 extends in a direction perpendicular to the plane direction of the transparent substrate 1 and has a rectangular shape as viewed from the extension direction of the grid-shaped convex portion (a predetermined direction: the Y-axis direction), that is, in a cross-sectional view orthogonal to the predetermined direction. The reflection layer has a function of a wire grid type polarizer and is used to attenuate the polarized wave (TE wave (S wave)) having an electric field component parallel to the longitudinal direction of the reflection layer and to transmit the polarized wave (TM wave (P wave)) having an electric field component orthogonal to the longitudinal direction of the reflection layer.

A material of forming the reflection layer is not particularly limited as long as the material has reflectance for the light of a use band. For example, a single element such as Al, Ag, Cu, Mo, Cr, Ti, Ni, W, Fe, Si, Ge, and Te or an alloy including one or more of these elements can be exemplified. Among these, the reflection layer is preferably formed of aluminum or aluminum alloy. Additionally, in addition to these metal materials, for example, an inorganic film or a resin film other than a metal formed with a high surface reflectance may be formed by coloring or the like.

The film thickness of the reflection layer is not particularly limited and is preferably, for example, 100 nm to 300 nm. Additionally, the film thickness of the reflection layer can be measured by, for example, the above-described electron microscopy.

In the polarizing plate of the invention, the width of the reflection layer needs to be substantially the same as that of the first dielectric layer to be described later and the minimum width thereof needs to be larger than the minimum width of the absorption layer to be described later. According to the invention, it is possible to realize the polarizing plate capable of excellently controlling the reflectance characteristics. Although the width of the reflection layer depends on the relationship with the pitch P of the grid-shaped convex portion, the width is preferably, for example, 35 nm to 45 nm. Additionally, the width can be measured by, for example, the above-described electron microscopy.

As a method of setting the minimum width of the reflection layer to be larger than the minimum width of the absorption layer, for example, a method of changing a balance using a combination of isotropic etching and anisotropic etching can be exemplified.

(First Dielectric Layer)

The first dielectric layer (the first dielectric layer 3 in FIG. 1) is formed on the reflection layer and the dielectric film extending in a band shape is arranged in the Y-axis direction corresponding to the absorption axis. Additionally, in the invention, different layers may exist between the reflection layer and the first dielectric layer.

The first dielectric layer 3 of the polarizing plate 10 according to an embodiment of the invention illustrated in FIG. 1 is laminated on the reflection layer to be perpendicular to the plane direction of the transparent substrate 1 and has a rectangular shape as viewed from the extension direction of the grid-shaped convex portion (a predetermined direction: the Y-axis direction), that is, in a cross-sectional view orthogonal to the predetermined direction.

The film thickness of the first dielectric layer is formed in a range in which polarized light reflected by the absorption layer is transmitted through the absorption layer and the phase of the polarized light reflected by the reflection layer is shifted by a half wavelength. Specifically, the film thickness of the first dielectric layer is appropriately set to a range of 1 to 500 nm capable of improving an interference effect by adjusting the phase of the polarized light. The film thickness of the first dielectric layer can be measured by, for example, the above-described electron microscopy.

As a material forming the first dielectric layer, general materials like Si oxide such as $SiO_2$, metal oxide such as $Al_2O_3$, beryllium oxide, and bismuth oxide, $MgF_2$, cryolite, germanium, titanium dioxide, silicon, magnesium fluoride, boron nitride, boron oxide, boron oxide, tantalum oxide, carbon, or a combination thereof can be exemplified. Among these, the first dielectric layer 3 is preferably formed of Si oxide.

The refractive index of the first dielectric layer is preferably larger than 1.0 and equal to or smaller than 2.5. Since the optical characteristics of the reflection layer are also influenced by the peripheral refractive index, it is possible to control polarizing characteristics by selecting the material of the first dielectric layer.

Further, when the film thickness or the refractive index of the first dielectric layer is appropriately adjusted, the TE wave reflected by the reflection layer can be returned to the reflection layer while being partially reflected when the light is transmitted through the absorption layer. Accordingly, it is possible to attenuate the light passing through the absorption layer by interference. In this way, when the TE wave is selectively attenuated, desired polarizing characteristics can be obtained.

In the polarizing plate of the invention, the width of the first dielectric layer needs to be substantially the same as that of the reflection layer and the minimum width thereof needs to be larger than the minimum width of the absorption layer to be described below. According to the invention, it is possible to realize the polarizing plate capable of excellently controlling the reflectance characteristics. Although the width of the first dielectric layer depends on the relationship with the pitch P of the grid-shaped convex portion, the width is preferably, for example, 35 nm to 45 nm. Additionally, the width can be measured by, for example, the above-described electron microscopy.

(Absorption Layer)

The absorption layer (the absorption layer 4 in FIG. 1) is formed on the first dielectric layer and is arranged to extend in a band shape in the Y-axis direction corresponding to the absorption axis. In the invention, as viewed from the Y-axis direction (a predetermined direction) corresponding to the absorption axis, the minimum width of the absorption layer is set to be smaller than the minimum width of the reflection layer and the first dielectric layer. In the invention, since the absorption layer has the above-described shape, it is possible to exhibit an effect of shifting the wavelength range of the light absorbing action. As a result, it is possible to realize the polarizing plate capable of excellently controlling the reflectance characteristics.

The absorption layer 4 of the polarizing plate 10 according to an embodiment of the invention illustrated in FIG. 1 has a substantially isosceles trapezoidal shape as viewed from the extension direction of the grid-shaped convex portion (a predetermined direction: the Y-axis direction), that is, in a cross-sectional view orthogonal to the predetermined direction and has a taper shape in which a side surface is inclined in a direction in which a width is narrowed toward the front end side (the opposite side of the transparent substrate 1).

In the embodiment, the maximum width of the absorption layer 4 becomes the width of the outermost surface near the transparent substrate 1 in the absorption layer 4 and is substantially the same as the maximum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Further, the minimum width of the absorption layer 4 becomes the width of the outermost surface opposite to the transparent substrate 1 in the absorption layer 4 and is smaller than the minimum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

As the material forming the absorption layer, one or more materials which have a light absorbing action and in which an extinction constant of an optical constant is not zero like a metal material, a semiconductor material or the like can be exemplified and these materials are appropriately selected depending on the wavelength range of light to be applied. As the metal material, a single element such as Ta, Al, Ag, Cu, Au, Mo, Cr, Ti, W, Ni, Fe, and Sn or an alloy including at least one of these elements can be exemplified. Further, as the semiconductor material, Si, Ge, Te, ZnO, and silicide materials ($\beta$-FeSi$_2$, MgSi$_2$, NiSi$_2$, BaSi$_2$, CrSi$_2$, CoSi$_2$, TaSi, and the like) can be exemplified. By using these materials, the polarizing plate 10 can obtain a high extinction ratio with respect to the visible light range to be applied. Among these, it is preferable that the absorption layer include Fe or Ta and further include Si.

When the semiconductor material is used as the absorption layer, the band gap energy of the semiconductor is involved in the absorption action and hence the band gap energy needs to be equal to or smaller than the use band. For example, when the material is used in visible light, it is necessary to use a material having absorption at a wavelength of 400 nm or more, that is, a material having a band gap of 3.1 eV or less.

The film thickness of the absorption layer is not particularly limited and is preferable, for example, 10 nm to 100 nm. The film thickness of the absorption layer 4 can be measured by, for example, the above-described electron microscopy.

Additionally, the absorption layer can be formed as a high-density film by a sputtering method or a vapor deposition method. Further, the absorption layer may be formed as two or more layers by different materials.

Although the maximum width of the absorption layer depends on the relationship with the pitch P of the grid-shaped convex portion, the maximum width is preferably, for example, 35 nm to 45 nm. Further, the maximum width of the absorption layer may be substantially the same as the width of, for example, the first dielectric layer located below the absorption layer. Additionally, the width can be measured by, for example, the above-described electron microscopy.

As described above, in the invention, as viewed from the Y-axis direction (a predetermined direction) corresponding to the absorption axis, the minimum width of the absorption layer needs to be smaller than the minimum width of the reflection layer and the first dielectric layer. According to the invention, it is possible to realize the polarizing plate capable of excellently controlling the reflectance characteristics. A ratio of the minimum width of the absorption layer with respect to the maximum width of the absorption layer is preferably, for example, smaller than 100% and in the range of 60 to 90%. Additionally, the width can be measured by, for example, the above-described electron microscopy.

(Diffusion Barrier Layer)

The polarizing plate of the invention may include the diffusion barrier layer between the first dielectric layer and the absorption layer. That is, in the polarizing plate illustrated in FIG. 1, the grid-shaped convex portion 6 includes the reflection layer 2, the first dielectric layer 3, the diffusion barrier layer, and the absorption layer 4 in order from the transparent substrate 1. Since the diffusion barrier layer is provided, the diffusion of the light on the absorption layer is prevented. This diffusion barrier layer can be formed by a metal film of Ta, W, Nb, or Ti.

(Protection Film)

Further, the light incident surface of the polarizing plate of the invention may be covered with a protection film formed by a dielectric in a range in which a change in optical characteristic is not influenced. The protection film is formed by a dielectric film and can be formed on, for example, the surface of the polarizing plate (the surface provided with the wire grid) by using a chemical vapor deposition (CVD) or an atomic layer deposition (ALD). Accordingly, it is possible to suppress an oxidation reaction more than necessary for the metal film.

(Organic Water-repellent Film)

Further, the light incident surface of the polarizing plate of the invention may be covered with an organic water-repellent film. The organic water-repellent film is formed of a fluorine-based silane compound such as perfluorodecyltriethoxysilane (FDTS) and can be formed by using, for example, the above-described CVD or ALD. Accordingly, it is possible to improve reliability such as moisture resistance of the polarizing plate.

Further, the invention is not limited to the above-described embodiment illustrated in FIG. 1 and modification and improvement within the scope of achieving the object of the invention are included in the invention.

Figure 9:
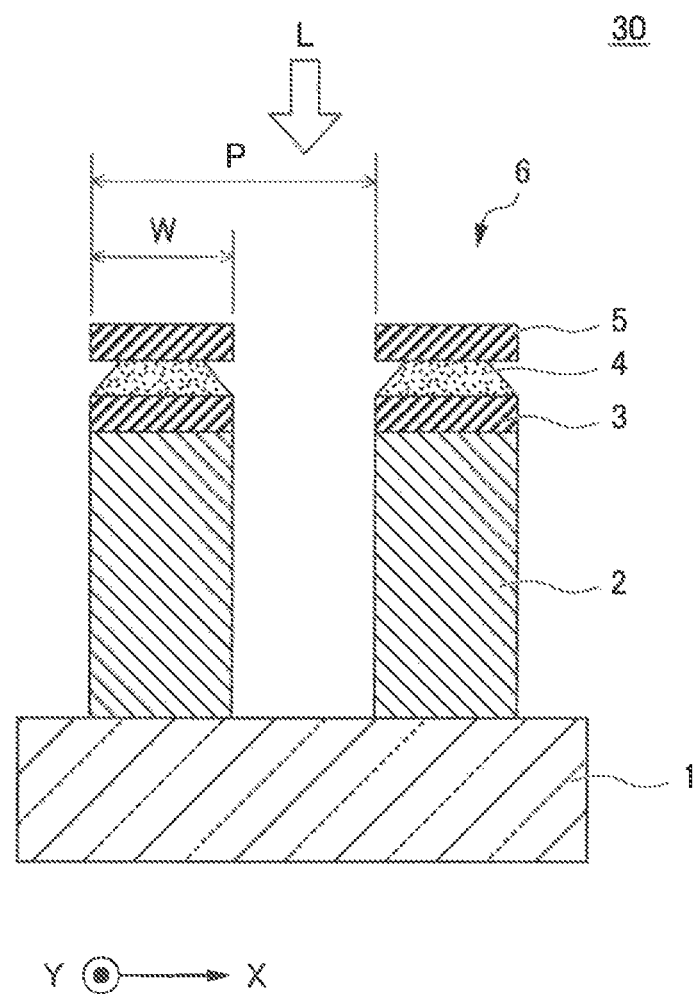
FIG. 9 is a cross-sectional schematic diagram illustrating a polarizing plate according to an embodiment of the invention.

FIG. 9 is a cross-sectional schematic diagram illustrating a polarizing plate 30 according to another embodiment of the invention. The polarizing plate 30 illustrated in FIG. 9 has the same configuration as that of the polarizing plate 10 illustrated in FIG. 1 except that the second dielectric layer 5 is formed on the absorption layer 4 of the polarizing plate 10 illustrated in FIG. 1 in the grid-shaped convex portion 6.

(Second Dielectric Layer)

The second dielectric layer 5 of the polarizing plate 30 illustrated in FIG. 9 is laminated on the absorption layer to be perpendicular to the plane direction of the transparent substrate 1 and has a rectangular shape as viewed from the extension direction of the grid-shaped convex portion (a predetermined direction: the Y-axis direction), that is, in a cross-sectional view orthogonal to the predetermined direction. Further, in the polarizing plate 30 illustrated in FIG. 9, the width of the second dielectric layer 5 is the same as the width of the first dielectric layer 3.

The film thickness, the material, the refractive index, the shape, and the like of the second dielectric layer are the same as those of the first dielectric layer.

In the embodiment illustrated in FIG. 9, the maximum width of the absorption layer 4 becomes the width of the outermost surface near the transparent substrate 1 in the absorption layer 4 and is substantially the same as the maximum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Further, the minimum width of the absorption layer 4 becomes the width of the outermost surface opposite to the transparent substrate 1 in the absorption layer 4 and is smaller than the minimum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Figure 17:
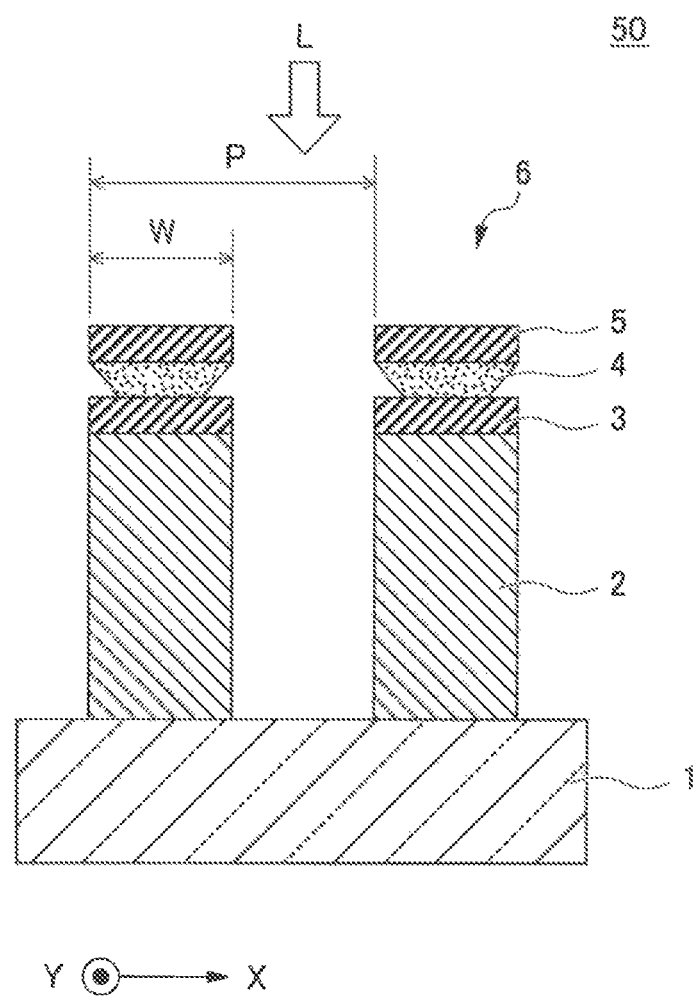
FIG. 17 is a cross-sectional schematic diagram illustrating a polarizing plate according to an embodiment of the invention.

FIG. 17 is a cross-sectional schematic diagram illustrating a polarizing plate 50 according to another embodiment of the invention. The polarizing plate 50 illustrated in FIG. 17 has a configuration in which the second dielectric layer 5 is formed on the absorption layer 4 in the grid-shaped convex portion 6 and has the same configuration as that of the polarizing plate 30 illustrated in FIG. 9 except that the shape of the absorption layer 4 is different.

The absorption layer 4 of the polarizing plate 50 illustrated in FIG. 17 has a substantially isosceles trapezoidal shape as viewed from the extension direction of the grid-shaped convex portion (a predetermined direction: the Y-axis direction), that is, in a cross-sectional view orthogonal to the predetermined direction and has a taper shape in which a side surface is inclined in a direction in which a width is narrowed toward the front end side (the opposite side of the transparent substrate 1).

In the embodiment illustrated in FIG. 17, the maximum width of the absorption layer 4 becomes the width of the outermost surface opposite to the transparent substrate 1 in the absorption layer 4 and is substantially the same as the maximum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Further, the minimum width of the absorption layer 4 becomes the width of the outermost surface near the transparent substrate 1 in the absorption layer 4 and is smaller than the minimum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Figure 18:
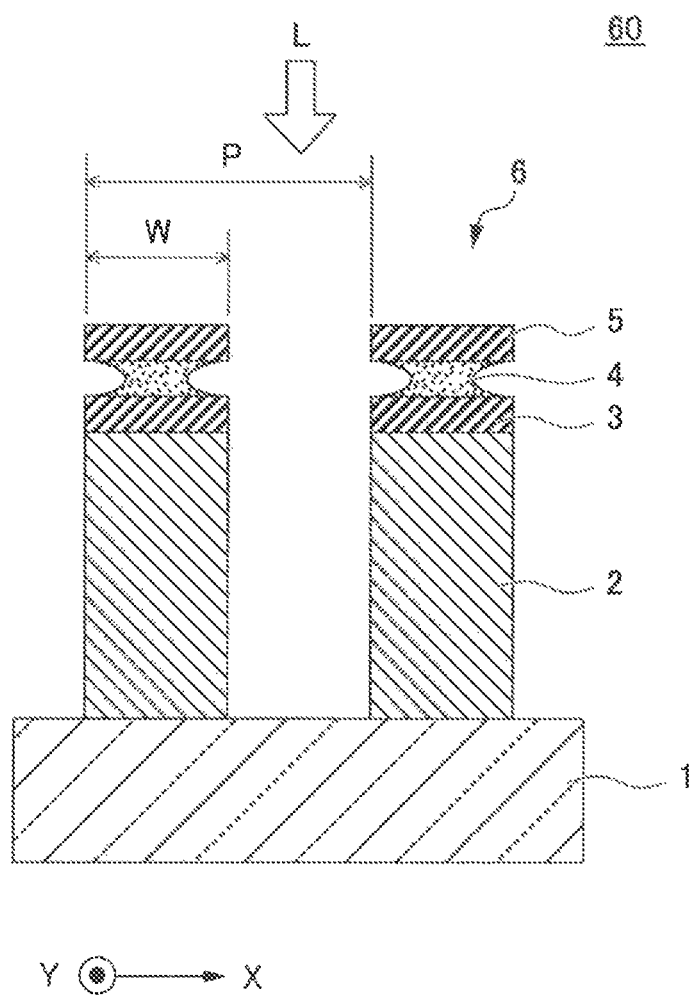
FIG. 18 is a cross-sectional schematic diagram illustrating a polarizing plate according to an embodiment.

FIG. 18 is a cross-sectional schematic diagram illustrating a polarizing plate 60 according to another embodiment of the invention. The polarizing plate 60 illustrated in FIG. 18 has a configuration in which the second dielectric layer 5 is formed on the absorption layer 4 in the grid-shaped convex portion 6 and has the same configuration as that of the polarizing plate 30 illustrated in FIG. 9 except that the shape of the absorption layer 4 is different.

The absorption layer 4 of the polarizing plate 60 illustrated in FIG. 18 has a shape in which the substantially center in the film thickness direction has the minimum width and a side portion contacting the first dielectric layer and the second dielectric layer has a maximum width as viewed from the extension direction of the grid-shaped convex portion (a predetermined direction: the Y-axis direction), that is, in a cross-sectional view orthogonal to the predetermined direction.

In the embodiment illustrated in FIG. 18, the maximum width of the absorption layer 4 becomes the length of the side portion contacting the first dielectric layer and the second dielectric layer and is substantially the same as the maximum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

Further, the minimum width of the absorption layer 4 becomes the width of the substantially center portion of the absorption layer 4 in the film thickness direction and is smaller than the minimum width of the reflection layer 2 and the first dielectric layer 3 having a rectangular shape as viewed from the extension direction of the grid-shaped convex portion 6 (a predetermined direction: the Y-axis direction), that is, in a cross-sectional view orthogonal to the predetermined direction.

[Polarizing Plate Manufacturing Method]

A polarizing plate manufacturing method of the invention includes a reflection layer forming step, a first dielectric layer forming step, an absorption layer forming step, and an etching step.

In the reflection layer forming step, the reflection layer is formed on one surface of the transparent substrate. In the first dielectric layer forming step, the first dielectric layer is formed on the reflection layer formed by the reflection layer forming step. In the absorption layer forming step, the absorption layer is formed on the first dielectric layer formed by the first dielectric layer forming step. In these layer forming steps, these layers can be formed by, for example, a sputtering method or a vapor deposition method.

In the etching step, the grid-shaped convex portion which is arranged on the transparent substrate at the pitch shorter than the wavelength of light of a use band is formed by selectively etching the lamination structure formed by the above-described layer forming steps. Specifically, a one-dimensional lattice-shaped mask pattern is formed by, for example, photolithography or nanoimprinting. Then, the grid-shaped convex portion which is arranged on the transparent substrate at the pitch shorter than the wavelength of light of a use band is formed by selectively etching the lamination structure. As the etching method, for example, a dry etching method using an etching gas corresponding to an etching object can be exemplified.

Particularly, in the invention, the reflection layer and the first dielectric layer are formed to have substantially the same width and the minimum width of the absorption layer is set to be smaller than the minimum width of the reflection layer and the first dielectric layer by changing a balance with the combination of isotropic etching and anisotropic etching.

In addition, the polarizing plate manufacturing method of the invention may include a step of coating the surface with a protection film formed of a dielectric. Further, the polarizing plate manufacturing method of the invention may include a step of coating the surface with an organic water-repellent film.

[Optical Apparatus]

An optical apparatus of the invention includes the above-described polarizing plate according to the invention. The polarizing plate according to the invention can be used for various applications. As the optical apparatus to be applied, for example, a liquid crystal projector, a head-up display, a digital camera, and the like can be exemplified. In particular, since the polarizing plate according to the invention is an inorganic polarizing plate having excellent heat resistance, the polarizing plate can be appropriately used for a liquid crystal projector, a head-up display, and the like requiring heat resistance as compared with an organic polarizing plate formed of an organic material.

When the optical apparatus according to the invention includes a plurality of polarizing plates, at least one of the plurality of polarizing plates may be the polarizing plate according to the invention. For example, when the optical apparatus according to the embodiment is a liquid-crystal projector, at least one of the polarizing plates disposed on the incident side and the emission side of the liquid crystal panel may be the polarizing plate according to the invention.

According to the polarizing plate, the polarizing plate manufacturing method, and the optical apparatus of the invention, the following effects are obtained.

The polarizing plate according to the invention has the wire grid structure including the transparent substrate and the grid-shaped convex portion arranged on the transparent substrate at the pitch shorter than the wavelength of light of a use band and extending in a predetermined direction, in which the reflection layer, the first dielectric layer, and the absorption layer are provided on the grid-shaped convex portion in order from the transparent substrate and a relationship of the minimum width of the reflection layer, the first dielectric layer, and the absorption layer as viewed from the predetermined direction is specified, thereby exhibiting an effect of shifting the wavelength range of the light absorbing action. As a result, the reflectance characteristics are excellently controlled. Thus, according to the invention, it is possible to provide the polarizing plate 10 capable of excellently controlling the reflectance characteristics, the polarizing plate manufacturing method, and the optical apparatus including the polarizing plate.

EXAMPLES

Next, examples of the invention will be described, but the invention is not limited to these examples.

Example 1 and Comparative Example 1

[Preparation of Polarizing Plate]

Figure 2:
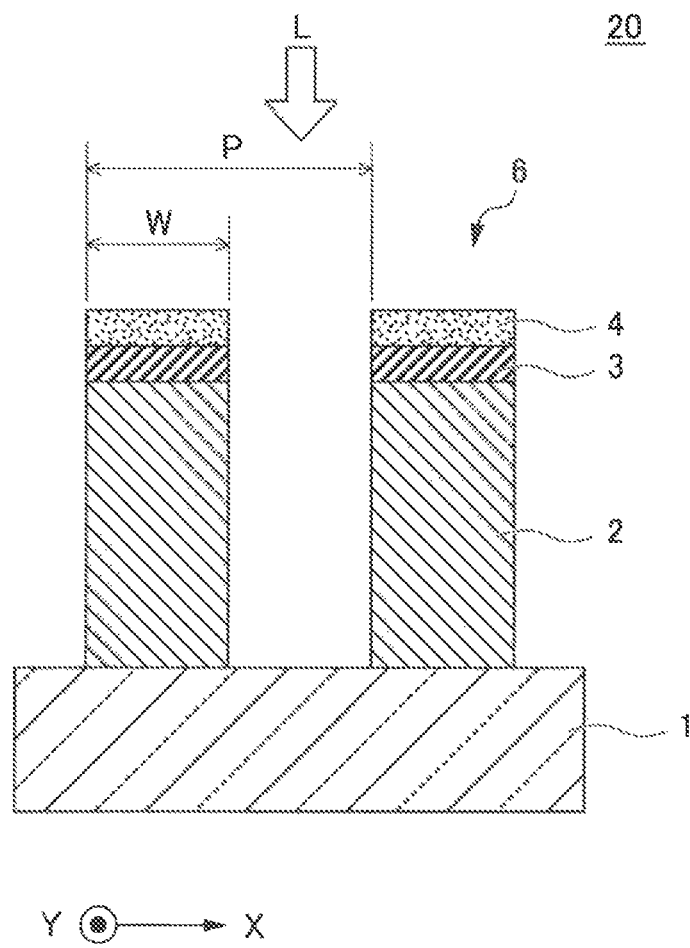
FIG. 2 is a cross-sectional schematic diagram illustrating a polarizing plate according to an embodiment with a conventional structure.

In Example 1, the polarizing plate 10 having a structure illustrated in FIG. 1 and optimized to each of the green band (wavelength λ=520 to 590 nm), the blue band (wavelength λ=430 to 510 nm), and the red band (wavelength λ=600 to 680 nm) was prepared and was provided for simulation. Further, as Comparative Example 1, a polarizing plate 20 different from the polarizing plate 10 of Example 1 only in the structure of the absorption layer 4 was prepared and was provided for simulation. The polarizing plate 20 of Comparative Example 1 has a structure illustrated in FIG. 2, the absorption layer 4 has a rectangular shape as viewed from the extension direction of the grid-shaped convex portion 6 (a predetermined direction: the Y-axis direction), that is, in a cross-sectional view orthogonal to the predetermined direction, and the reflection layer 2 and the first dielectric layer 3 are formed to have substantially the same width.

[Simulation Method]

The optical characteristics of the polarizing plate 10 and the polarizing plate 20 were verified by electromagnetic field simulation according to a rigorous coupled wave analysis (RCWA) method. For the simulation, grating simulator Gsolver manufactured from Grating Solver Development was used.

[Simulation Result]

Figure 3:
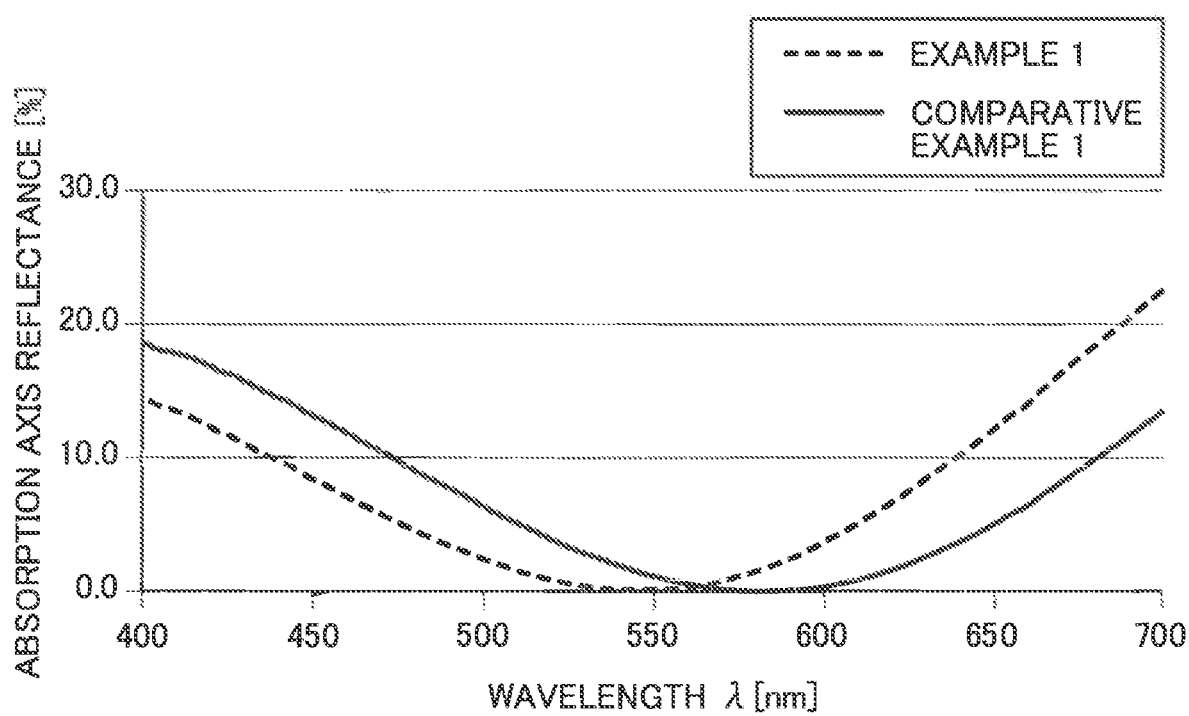
FIG. 3 is a graph showing a result obtained by verifying a relationship between a wavelength and an absorption axis reflectance for a polarizing plate illustrated in FIG. 1 and a polarizing plate illustrated in FIG. 2 optimized to a green band (wavelength λ=520 to 590 nm) by simulation.
Figure 4:
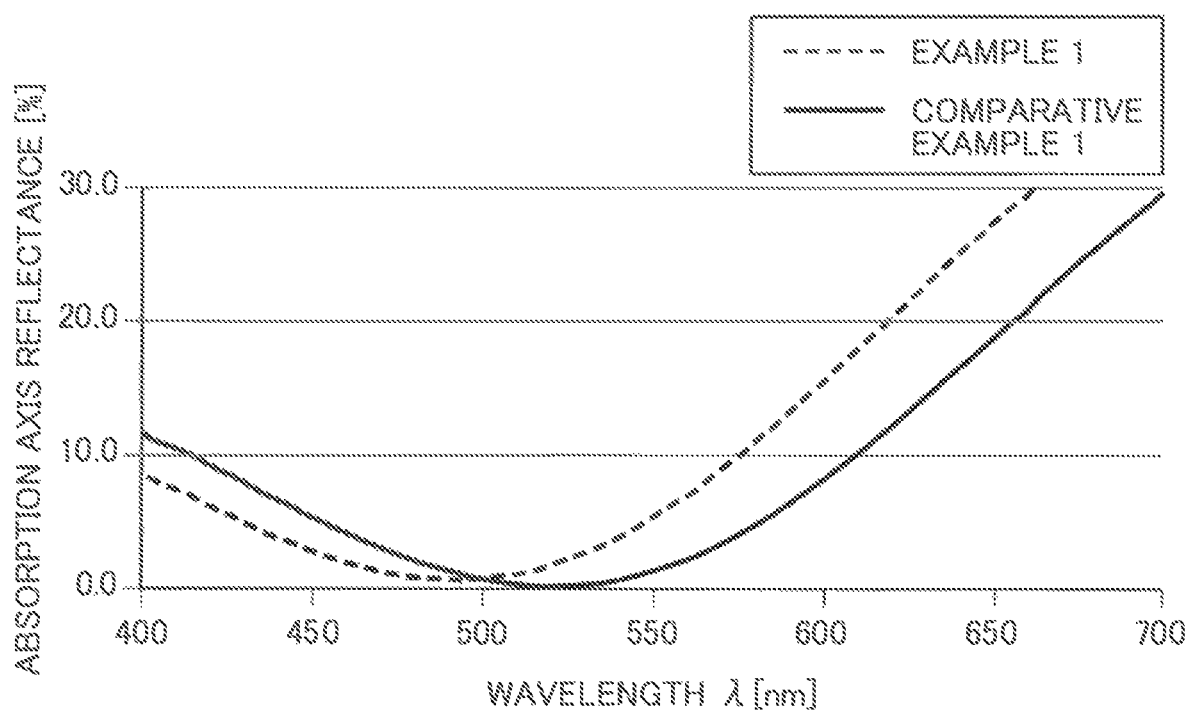
FIG. 4 is a graph showing a result obtained by verifying a relationship between the wavelength and the absorption axis reflectance for the polarizing plate illustrated in FIG. 1 and the polarizing plate illustrated in FIG. 2 optimized to a blue band (wavelength λ=430 to 510 nm) by simulation.
Figure 5:
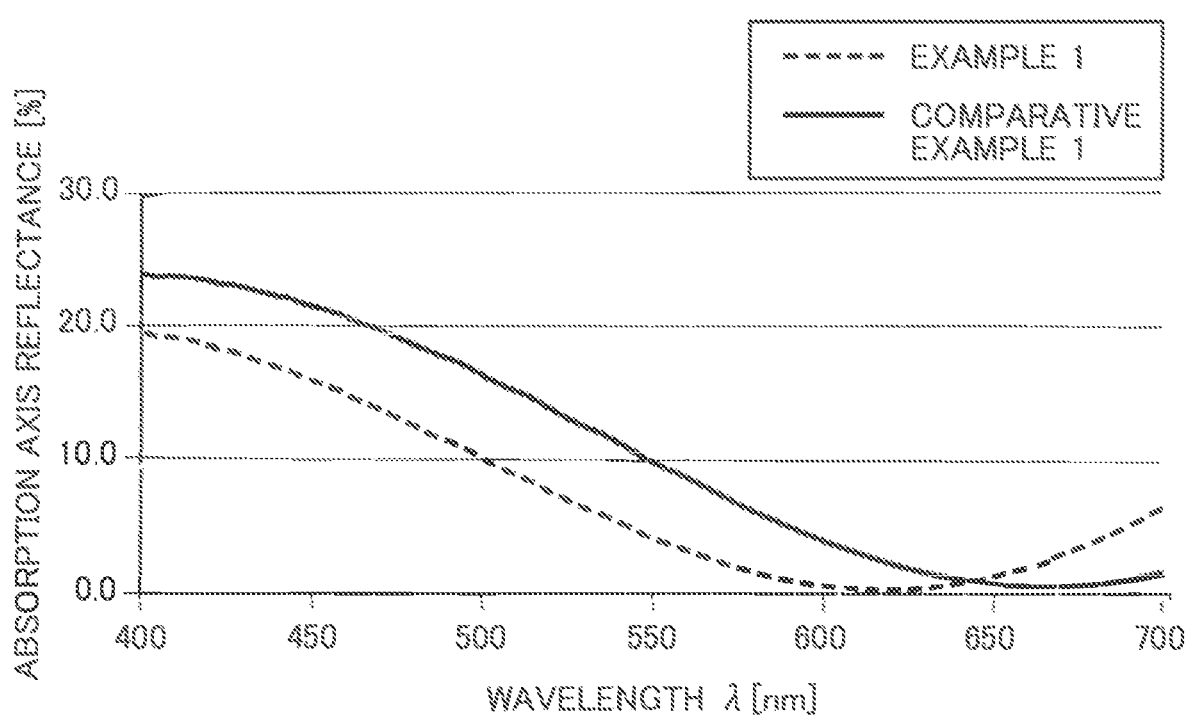
FIG. 5 is a graph showing a result obtained by verifying a relationship between the wavelength and the absorption axis reflectance for the polarizing plate illustrated in FIG. 1 and the polarizing plate illustrated in FIG. 2 optimized to a red band (wavelength λ=600 to 680 nm) by simulation.

FIG. 3 is a graph showing a result obtained by verifying a relationship between the wavelength and the absorption axis reflectance for the polarizing plate 10 and the polarizing plate 20 optimized to the green band (wavelength λ=520 to 590 nm). FIG. 4 is a graph showing a result obtained by verifying a relationship between the wavelength and the absorption axis reflectance for the polarizing plate 10 and the polarizing plate 20 optimized to the blue band (wavelength λ=430 to 510 nm). FIG. 5 is a graph showing a result obtained by verifying a relationship between the wavelength and the absorption axis reflectance for the polarizing plate 10 and the polarizing plate 20 optimized to the red band (wavelength λ=600 to 680 nm).

In FIGS. 3 to 5, the horizontal axis indicates the wavelength λ (nm) and the vertical axis indicates the absorption axis reflectance (%). Here, the absorption axis reflectance means the reflectance of the polarized light (TE wave) incident to the polarizing plate in the absorption axis direction (the Y-axis direction). Further, in FIGS. 3 to 5, a graph indicated by a dashed line shows the result of the polarizing plate 10 of the invention corresponding to Example 1 and a graph indicated by a solid line shows the result of the polarizing plate 20 corresponding to Comparative Example 1.

As shown in FIGS. 3 to 5, when the polarizing plate 10 of Example 1 is compared with the polarizing plate 20 of Comparative Example 1, the waveform position is shifted so that the absorption axis reflectance is suppressed to be low in all of the green band (wavelength λ=520 to 590 nm), the blue band (wavelength λ=430 to 510 nm), and the red band (wavelength λ=600 to 680 nm).

Figure 6:
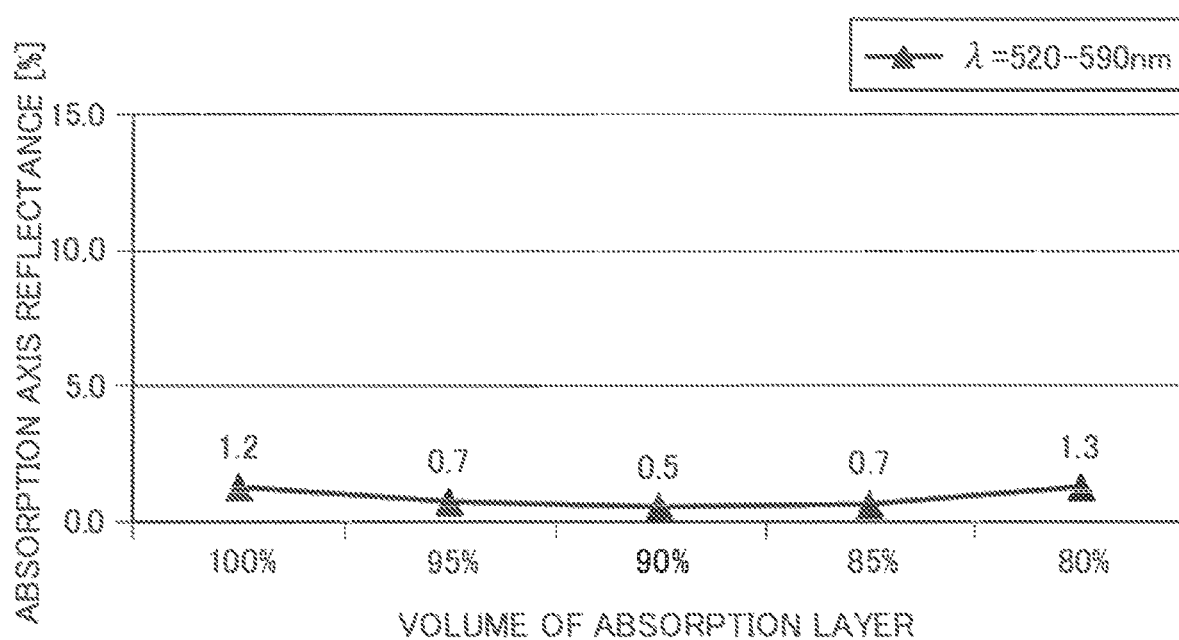
FIG. 6 is a graph showing a result obtained by verifying a relationship between a volume of an absorption layer and an absorption axis reflectance in a green band (wavelength λ=520 to 590 nm) for the polarizing plate illustrated in FIG. 1 and the polarizing plate illustrated in FIG. 2 optimized to the green band (wavelength λ=520 to 590 nm) by simulation.
Figure 7:
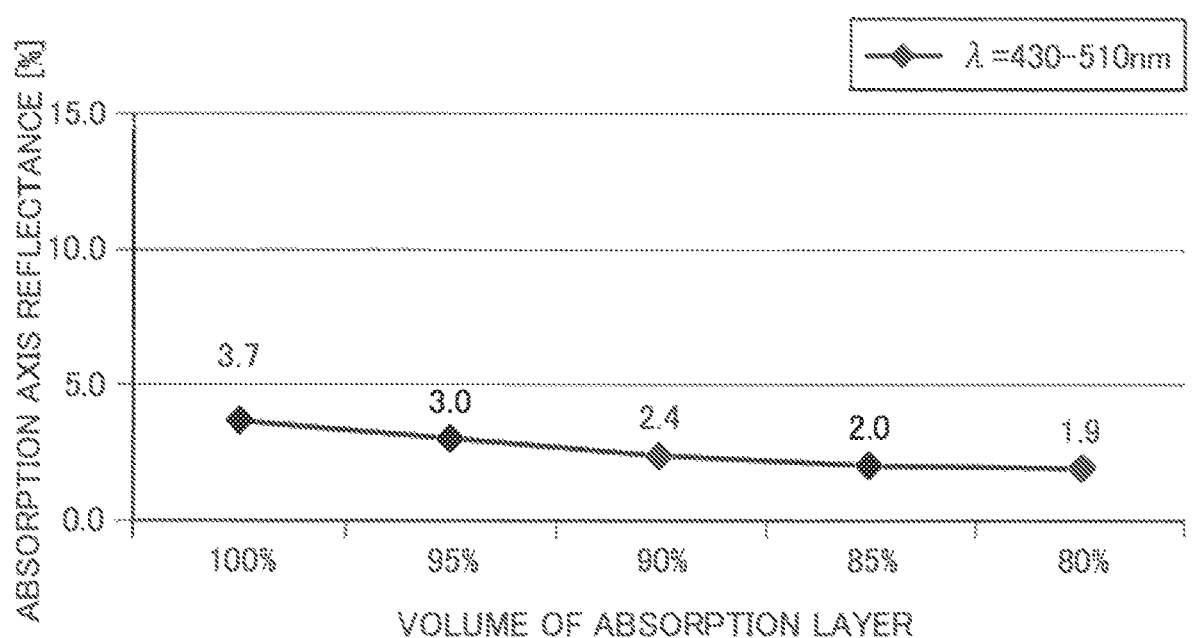
FIG. 7 is a graph showing a result obtained by verifying a relationship between the volume of the absorption layer and the absorption axis reflectance in a blue band (wavelength λ=430 to 510 nm) for the polarizing plate illustrated in FIG. 1 and the polarizing plate illustrated in FIG. 2 optimized to the blue band (wavelength λ=430 to 510 nm) by simulation.
Figure 8:
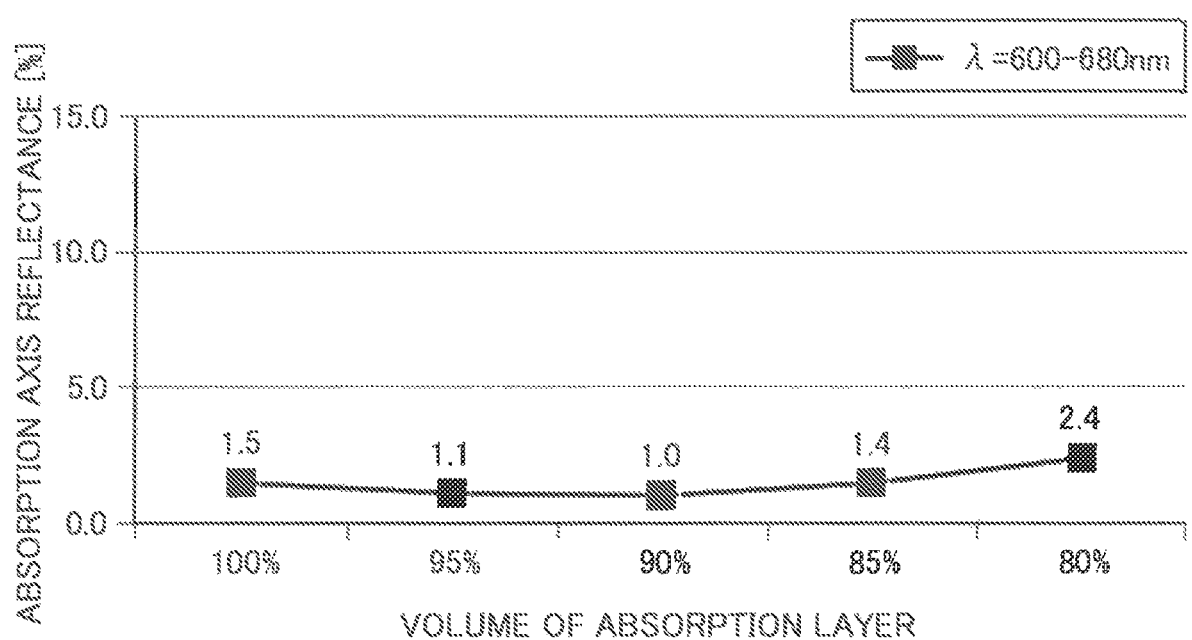
FIG. 8 is a graph showing a result obtained by verifying a relationship between the volume of the absorption layer and the absorption axis reflectance in a red band (wavelength λ=600 to 680 nm) for the polarizing plate illustrated in FIG. 1 and the polarizing plate illustrated in FIG. 2 optimized to the red band (wavelength λ=600 to 680 nm) by simulation.

FIG. 6 is a graph showing a result obtained by verifying a relationship between the volume of the absorption layer and the absorption axis reflectance in the green band (wavelength λ=520 to 590 nm) for the polarizing plate 10 and the polarizing plate 20 optimized to the green band (wavelength λ=520 to 590 nm) by simulation. FIG. 7 is a graph showing a result obtained by verifying a relationship between the volume of the absorption layer and the absorption axis reflectance in the blue band (wavelength λ=430 to 510 nm) for the polarizing plate 10 and the polarizing plate 20 optimized to the blue band (wavelength λ=430 to 510 nm) by simulation. FIG. 8 is a graph showing a result obtained by verifying a relationship between the volume of the absorption layer and the absorption axis reflectance in the red band (wavelength λ=600 to 680 nm) for the polarizing plate 10 and the polarizing plate 20 optimized to the red band (wavelength λ=600 to 680 nm) by simulation.

In FIGS. 6 to 8, the horizontal axis indicates the volume of the absorption layer and the vertical axis indicates the absorption axis reflectance (%). Here, as described above, the absorption axis reflectance means the reflectance of the polarized light (TE wave) incident to the polarizing plate in the absorption axis direction (the Y-axis direction). In FIGS. 6 to 8, a point in which the volume of the absorption layer becomes 100% shows the result of the polarizing plate 20 corresponding to Comparative Example 1 and a range in which the volume becomes smaller than 100% shows the result of the polarizing plate 10 of the invention corresponding to Example 1.

As shown in FIGS. 6 to 8, since the polarizing plate 10 of Example 1 can control the reflectance characteristics in all of the green band (wavelength λ=520 to 590 nm), the blue band (wavelength λ=430 to 510 nm), and the red band (wavelength λ=600 to 680 nm) by shifting the waveform position with a change in volume of the absorption layer, the polarizing plate can be optimized.

Example 2 and Comparative Example 2

[Preparation of Polarizing Plate]

Figure 10:
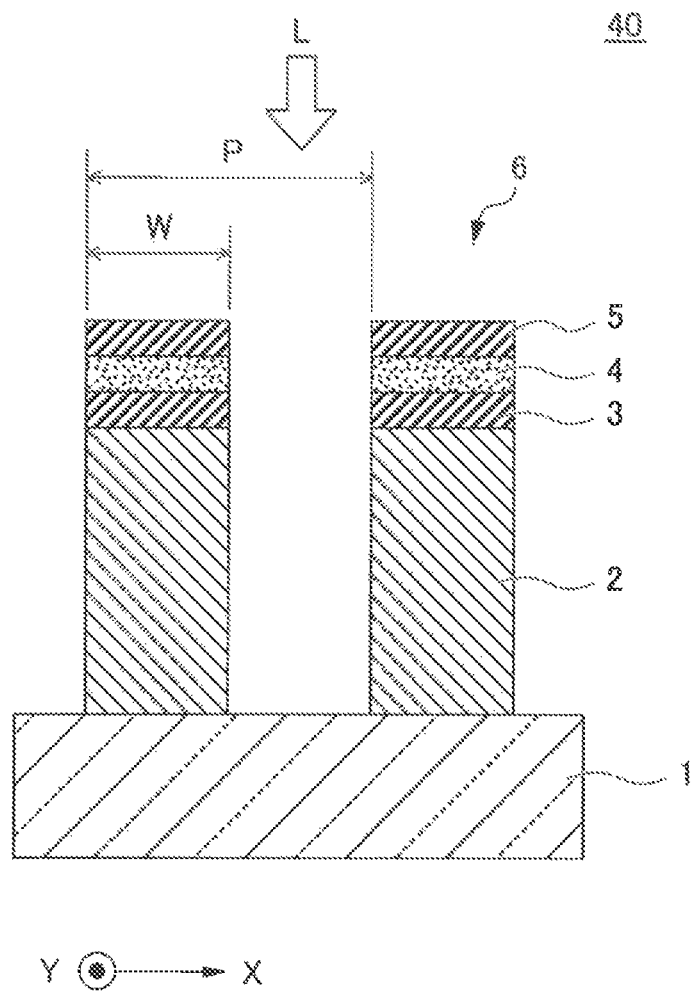
FIG. 10 is a cross-sectional schematic diagram illustrating a polarizing plate according to an embodiment with a conventional structure.

In Example 2, the polarizing plate 30 having a structure illustrated in FIG. 9 and optimized to each of the green band (wavelength λ=520 to 590 nm), the blue band (wavelength λ=430 to 510 nm), and the red band (wavelength λ=600 to 680 nm) was prepared and was provided for simulation. Further, as Comparative Example 2, a polarizing plate 40 different from the polarizing plate 30 of Example 2 only in the structure of the absorption layer 4 was prepared and was provided for simulation. The polarizing plate 40 of Comparative Example 2 has a structure illustrated in FIG. 10, the absorption layer 4 has a rectangular shape as viewed from the extension direction of the grid-shaped convex portion 6 (a predetermined direction: the Y-axis direction), that is, in a cross-sectional view orthogonal to the predetermined direction and the reflection layer 2 and the first dielectric layer 3 are formed to have substantially the same width.

[Simulation Method]

The optical characteristics of the polarizing plate 30 and the polarizing plate 40 were verified by electromagnetic field simulation according to a rigorous coupled wave analysis (RCWA) method. For the simulation, grating simulator Gsolver manufactured from Grating Solver Development was used.

[Simulation Result]

Figure 11:
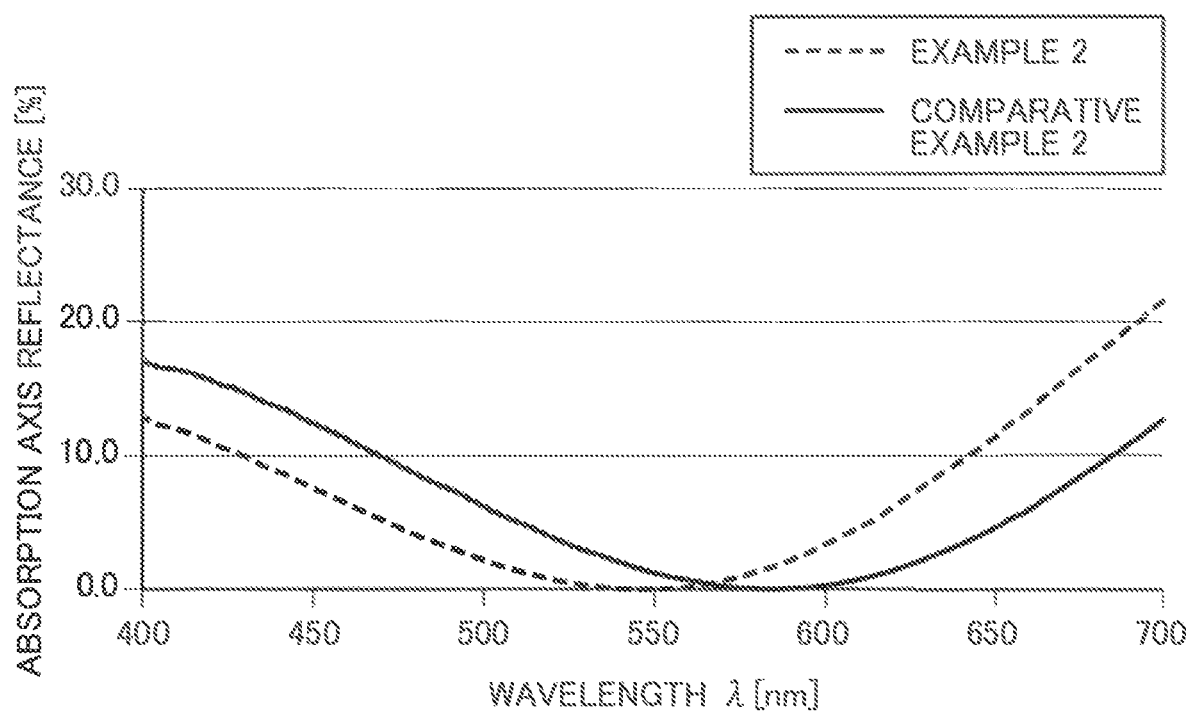
FIG. 11 is a graph showing a result obtained by verifying a relationship between a wavelength and an absorption axis reflectance for a polarizing plate illustrated in FIG. 9 and a polarizing plate illustrated in FIG. 10 optimized to a green band (wavelength λ=520 to 590 nm) by simulation.
Figure 12:
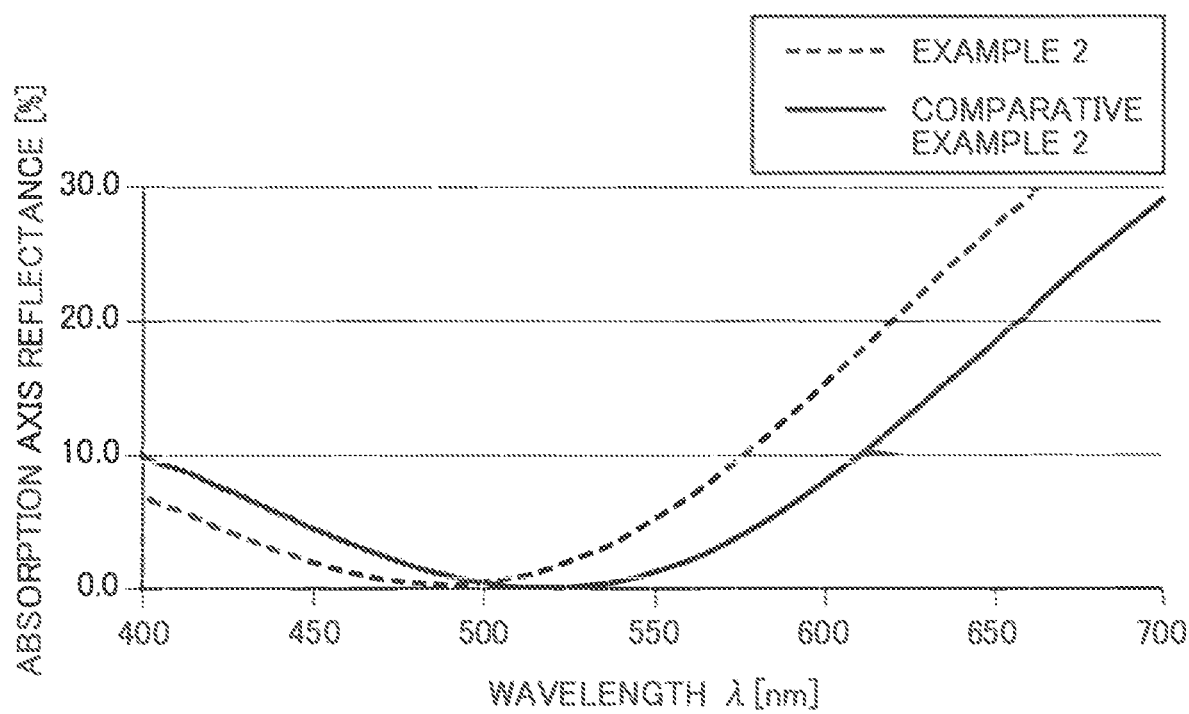
FIG. 12 is a graph showing a result obtained by verifying a relationship between the wavelength and the absorption axis reflectance for the polarizing plate illustrated in FIG. 9 and the polarizing plate illustrated in FIG. 10 optimized to a blue band (wavelength λ=430 to 510 nm) by simulation.
Figure 13:
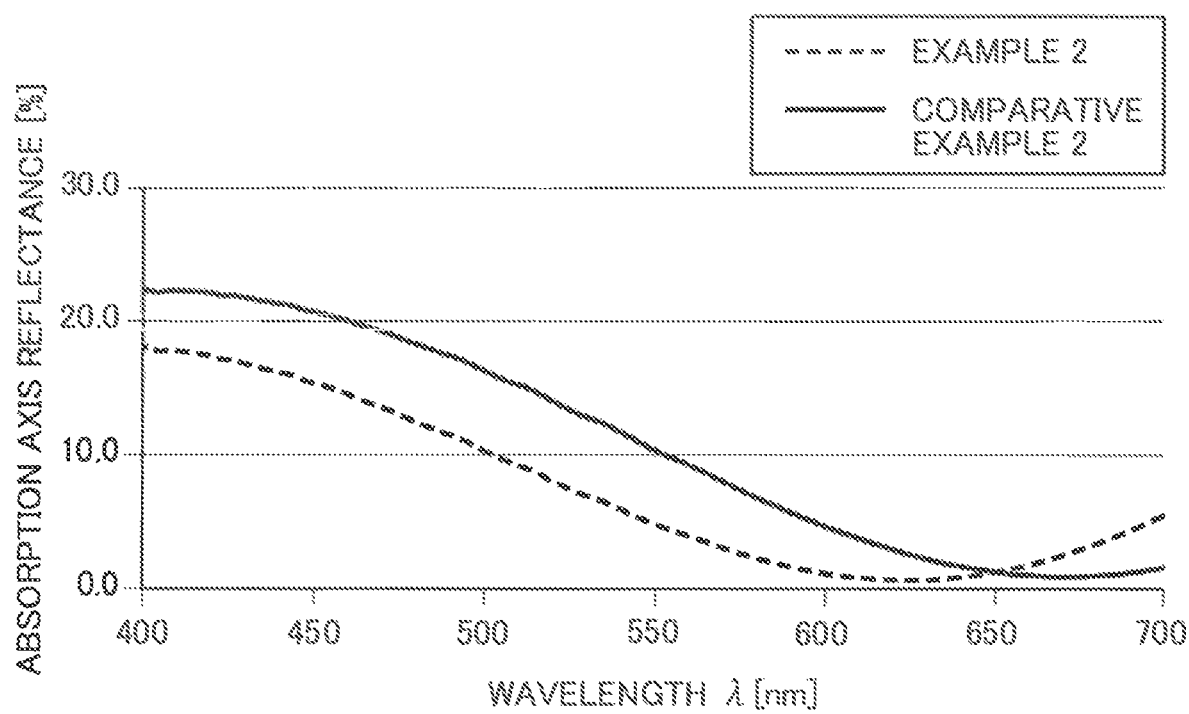
FIG. 13 is a graph showing a result obtained by verifying a relationship between the wavelength and the absorption axis reflectance for the polarizing plate illustrated in FIG. 9 and the polarizing plate illustrated in FIG. 10 optimized to a red band (wavelength λ=600 to 680 nm) by simulation.

FIG. 11 is a graph showing a result obtained by verifying a relationship between the wavelength and the absorption axis reflectance for the polarizing plate 30 and the polarizing plate 40 optimized to the green band (wavelength λ=520 to 590 nm). FIG. 12 is a graph showing a result obtained by verifying a relationship between the wavelength and the absorption axis reflectance for the polarizing plate 30 and the polarizing plate 40 optimized to the blue band (wavelength λ=430 to 510 nm). FIG. 13 is a graph showing a result obtained by verifying a relationship between the wavelength and the absorption axis reflectance for the polarizing plate 30 and the polarizing plate 40 optimized to the red band (wavelength λ=600 to 680 nm).

In FIGS. 11 to 13, the horizontal axis indicates the wavelength λ (nm) and the vertical axis indicates the absorption axis reflectance (%). Here, the absorption axis reflectance means the reflectance of the polarized light (TE wave) incident to the polarizing plate in the absorption axis direction (the Y-axis direction). Further, in FIGS. 11 to 13, a graph indicated by a dashed line shows the result of the polarizing plate 30 of the invention corresponding to Example 2 and a graph indicated by a solid line shows the result of the polarizing plate 40 corresponding to Comparative Example 2.

As shown in FIGS. 11 to 13, when the polarizing plate 30 of Example 2 is compared with the polarizing plate 40 of Comparative Example 2, the waveform position is shifted so that the absorption axis reflectance is suppressed to be low in all of the green band (wavelength λ=520 to 590 nm), the blue band (wavelength λ=430 to 510 nm), and the red band (wavelength λ=600 to 680 nm).

Figure 14:
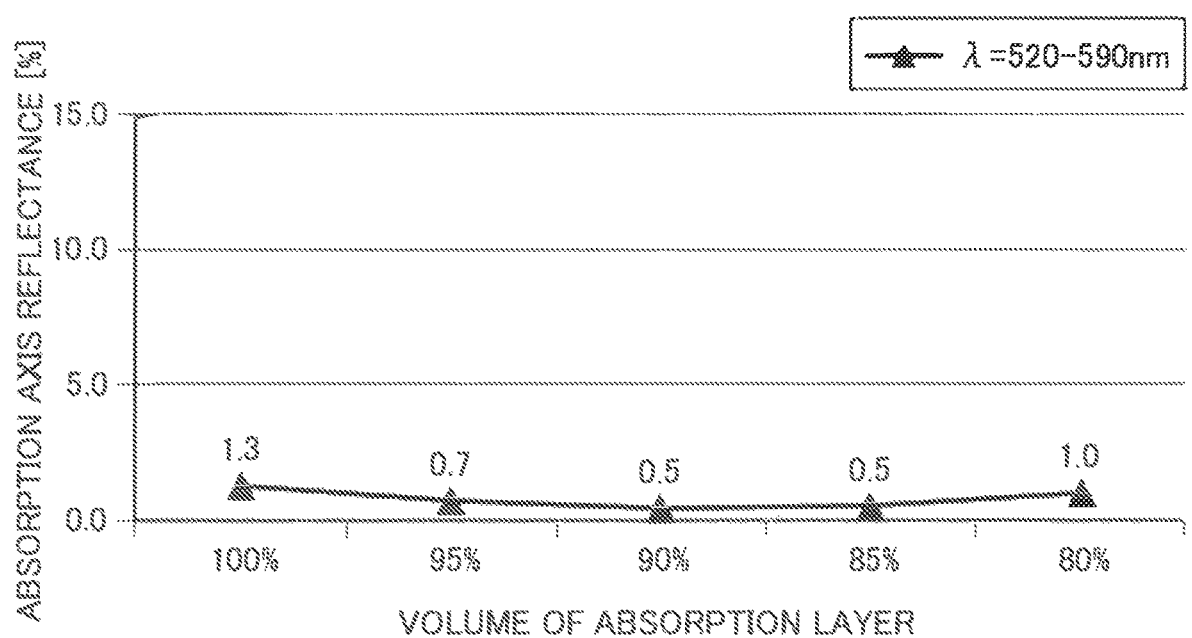
FIG. 14 is a graph showing a result obtained by verifying a relationship between the volume of the absorption layer and the absorption axis reflectance in a green band (wavelength λ=520 to 590 nm) for the polarizing plate illustrated in FIG. 9 and the polarizing plate illustrated in FIG. 10 optimized to the green band (wavelength λ=520 to 590 nm) by simulation.
Figure 15:
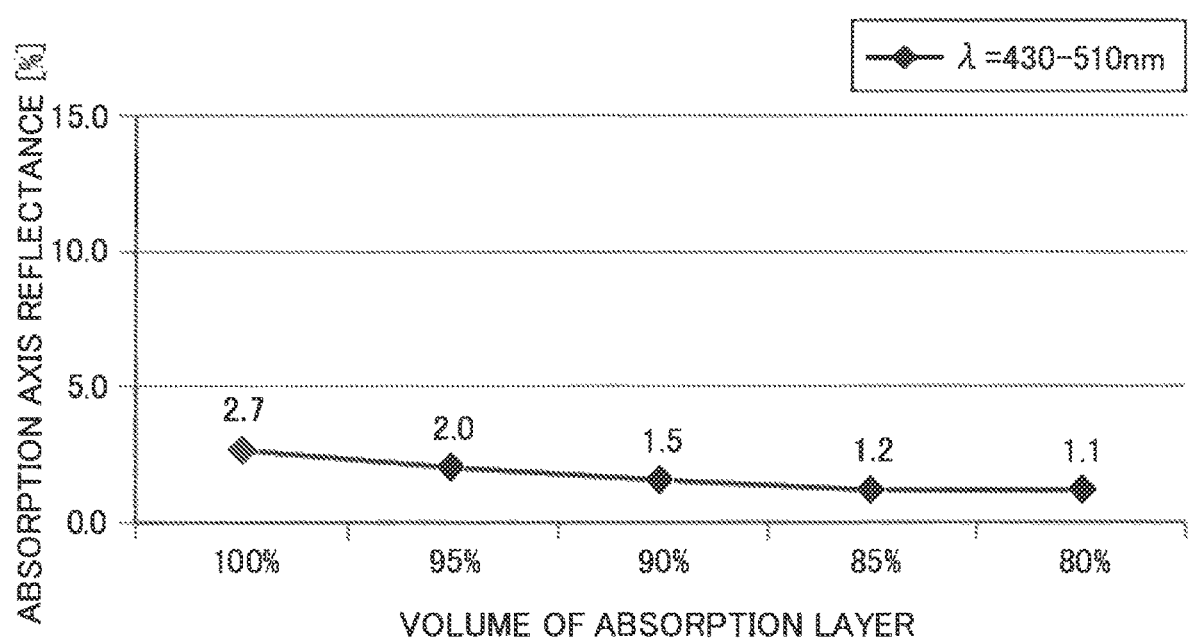
FIG. 15 is a graph showing a result obtained by verifying a relationship between the volume of the absorption layer and the absorption axis reflectance in a blue band (wavelength λ=430 to 510 nm) for the polarizing plate illustrated in FIG. 9 and the polarizing plate illustrated in FIG. 10 optimized to the blue band (wavelength λ=430 to 510 nm) by simulation.
Figure 16:
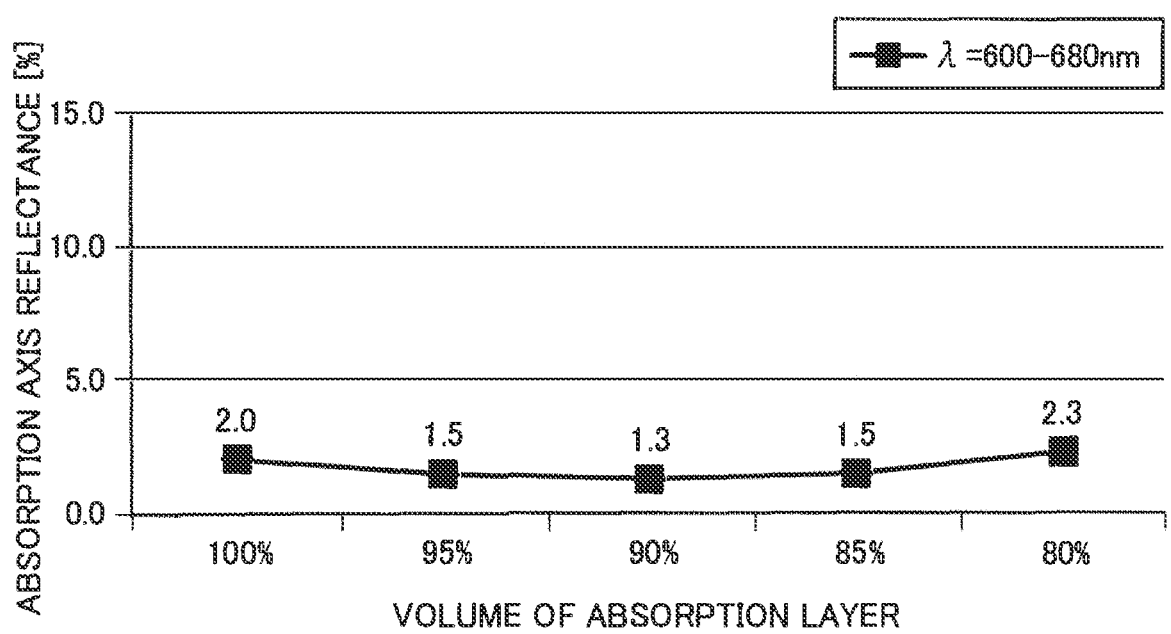
FIG. 16 is a graph showing a result obtained by verifying a relationship between the volume of the absorption layer and the absorption axis reflectance in a red band (wavelength λ=600 to 680 nm) for the polarizing plate illustrated in FIG. 9 and the polarizing plate illustrated in FIG. 10 optimized to the red band (wavelength λ=600 to 680 nm) by simulation.

FIG. 14 is a graph showing a result obtained by verifying a relationship between the volume of the absorption layer and the absorption axis reflectance in the green band (wavelength λ=520 to 590 nm) for the polarizing plate 30 and the polarizing plate 40 optimized to the green band (wavelength λ=520 to 590 nm) by simulation. FIG. 15 is a graph showing a result obtained by verifying a relationship between the volume of the absorption layer and the absorption axis reflectance in the blue band (wavelength λ=430 to 510 nm) for the polarizing plate 30 and the polarizing plate 40 optimized to the blue band (wavelength λ=430 to 510 nm) by simulation. FIG. 16 is a graph showing a result obtained by verifying a relationship between the volume of the absorption layer and the absorption axis reflectance in the red band (wavelength λ=600 to 680 nm) for the polarizing plate 30 and the polarizing plate 40 optimized to the red band (wavelength λ=600 to 680 nm) by simulation.

In FIGS. 14 to 16, the horizontal axis indicates the volume of the absorption layer and the vertical axis indicates the absorption axis reflectance (%). Here, as described above, the absorption axis reflectance means the reflectance of the polarized light (TE wave) incident to the polarizing plate in the absorption axis direction (the Y-axis direction). In FIGS. 14 to 16, a point in which the volume of the absorption layer becomes 100% shows the result of the polarizing plate 40 corresponding to Comparative Example 2 and a range in which the volume becomes smaller than 100% shows the result of the polarizing plate 30 of the invention corresponding to Example 2.

As shown in FIGS. 14 to 16, since the polarizing plate 30 of Example 2 can control the reflectance characteristics in all of the green band (wavelength λ=520 to 590 nm), the blue band (wavelength λ=430 to 510 nm), and the red band (wavelength λ=600 to 680 nm) by shifting the waveform position with a change in volume of the absorption layer, the polarizing plate can be optimized.

EXPLANATION OF REFERENCE NUMERALS 10, 20, 30, 40, 50, 60 POLARIZING PLATE
1 TRANSPARENT SUBSTRATE
2 REFLECTION LAYER
3 FIRST DIELECTRIC LAYER
4 ABSORPTION LAYER
5 SECOND DIELECTRIC LAYER
6 GRID-SHAPED CONVEX PORTION
P PITCH OF GRID-SHAPED CONVEX PORTION
W WIDTH
L LIGHT

What is claimed is:

1. A polarizing plate with a wire grid structure, comprising:
   a transparent substrate; and
   a grid-shaped convex portion which is arranged on the transparent substrate at a pitch shorter than a wavelength of light of a use band and extends in a predetermined direction,
   wherein the grid-shaped convex portion includes a reflection layer, a first dielectric layer, and an absorption layer in order from the transparent substrate, and
   wherein as viewed from the predetermined direction, the reflection layer and the first dielectric layer have substantially the same width, a minimum width of the absorption layer is smaller than a minimum width of the reflection layer and the first dielectric layer and the absorption layer is substantially isosceles trapezoidal, and wherein the first dielectric layer is formed of Si oxide, and wherein a second dielectric layer is provided on a surface of the absorption layer that is opposite to the first dielectric layer, and wherein the minimum width of the absorption layer is smaller than a minimum width of the second dielectric layer as viewed from the predetermined direction.

2. The polarizing plate according to claim 1, wherein the reflection layer is substantially rectangular as viewed from the predetermined direction.

3. The polarizing plate according to claim 1, wherein the first dielectric layer is substantially rectangular as viewed from the predetermined direction.

4. The polarizing plate according to claim 1, wherein the transparent substrate is transparent to a wavelength of light of a use band and is formed of glass, crystal, or sapphire.

5. The polarizing plate according to claim 1, wherein the reflection layer is formed of aluminum or aluminum alloy.

6. The polarizing plate according to claim 1, wherein the second dielectric layer is formed of Si oxide.

7. The polarizing plate according to claim 1, wherein the absorption layer includes Fe or Ta and also includes Si.

8. The polarizing plate according to claim 1, wherein a surface of the polarizing plate to which light is incident is covered with a protection film formed of a dielectric.

9. The polarizing plate according to claim 1, wherein a surface of the polarizing plate to which light is incident is covered with an organic water-repellent film.

10. An optical apparatus comprising:

the polarizing plate according to claim 1.

* * * * *